(12) United States Patent
Müller

(10) Patent No.: US 8,254,426 B2
(45) Date of Patent: *Aug. 28, 2012

(54) SURFACE EMITTING SEMICONDUCTOR COMPONENT, AND LASER DEVICE INCLUDING SUCH COMPONENT

(75) Inventor: Martin Müller, Regenstauf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 251 days.

This patent is subject to a terminal disclaimer.

(21) Appl. No.: 11/634,461

(22) Filed: Dec. 5, 2006

(65) Prior Publication Data

US 2007/0153867 A1    Jul. 5, 2007

(30) Foreign Application Priority Data

Dec. 5, 2005 (DE) .......................... 10 2005 058 009
Mar. 8, 2006 (DE) .......................... 10 2006 010 728

(51) Int. Cl.
*H01S 5/183* (2006.01)
*H01S 5/14* (2006.01)

(52) U.S. Cl. ............... 372/50.124; 372/43.01; 372/44.01

(58) Field of Classification Search ............. 372/50.124, 372/43.01, 44.01

See application file for complete search history.

(56) References Cited

U.S. PATENT DOCUMENTS

| | | | |
|---|---|---|---|
| 6,236,670 B1 | 5/2001 | Nagle et al. | |
| 6,393,038 B1 | 5/2002 | Raymond et al. | |
| 6,493,371 B1 | 12/2002 | Boucart et al. | |
| 6,535,541 B1 | 3/2003 | Boucart et al. | |
| 6,760,357 B1 | 7/2004 | Boucart et al. | |
| 6,778,582 B1 * | 8/2004 | Mooradian | 372/97 |
| 7,778,304 B2 * | 8/2010 | Muller | 372/68 |
| 7,856,045 B2 * | 12/2010 | Philippens et al. | 372/96 |
| 2002/0090013 A1 * | 7/2002 | Murry et al. | 372/36 |
| 2003/0053506 A1 | 3/2003 | Coldren | |
| 2004/0033025 A1 * | 2/2004 | Richard et al. | 385/49 |
| 2004/0076209 A1 | 4/2004 | Bour et al. | |

(Continued)

FOREIGN PATENT DOCUMENTS

DE    102 41 192 A1    3/2004

(Continued)

OTHER PUBLICATIONS

Zhu Wenjune et al., "Analysis of the operating point of a novel multiple-active-region tunneling-regenerated vertical-cavity surface-emitting laser", Solid-State and Integrated-Circuit Technology, 2001. Proceedings. 6th International Conference on Oct. 22-25, 2001, pp. 1306-1309.

(Continued)

*Primary Examiner* — Jessica Stultz
*Assistant Examiner* — Michael Carter
(74) *Attorney, Agent, or Firm* — Cozen O'Connor

(57) ABSTRACT

A surface emitting semiconductor component with an emission direction that has a semiconductor body. The semiconductor body has a plurality of active regions for the generation of radiation and are spaced apart from one another, wherein between two active regions a tunnel junction is monolithically integrated in the semiconductor body. The two active regions are electrically conductively connected by means of the tunnel junction, and the semiconductor component is provided for operation with an external resonator. A laser device comprising a semiconductor component of this type and an external resonator is also disclosed.

27 Claims, 4 Drawing Sheets

U.S. PATENT DOCUMENTS

2006/0078027 A1    4/2006    Kim
2006/0078072 A1*   4/2006    Cheon et al. .................. 375/326
2006/0104327 A1    5/2006    Karnutsch et al.

FOREIGN PATENT DOCUMENTS

| EP | 1 403 935 | | 3/2004 |
|---|---|---|---|
| WO | WO 9507566 | | 3/1995 |
| WO | WO 98/43329 | | 10/1998 |
| WO | WO 01/63708 | A2 | 8/2001 |
| WO | WO 01/67563 | | 9/2001 |
| WO | WO 2004/064211 | A1 | 7/2004 |
| WO | WO 2005/048424 | A1 | 5/2005 |

OTHER PUBLICATIONS

Korshak A N et al., "Tunnel-junction-connected distributed-feedback vertical-cavity surface-emitting laser" Applied Physics Letters, AIP, American Institute of Physics, vol. 73, No. 11, Sep. 1998, pp. 1475-1477.

Knödl T et al., "Bistability in bipolar cascade VCSELs", Electronics Letters, IEE Stevenage, GB, vol. 38, No. 8, Apr. 2002.

Search Report dated Feb. 15, 2007 issued for the corresponding European Patent Application No. 06 02 5133.

* cited by examiner

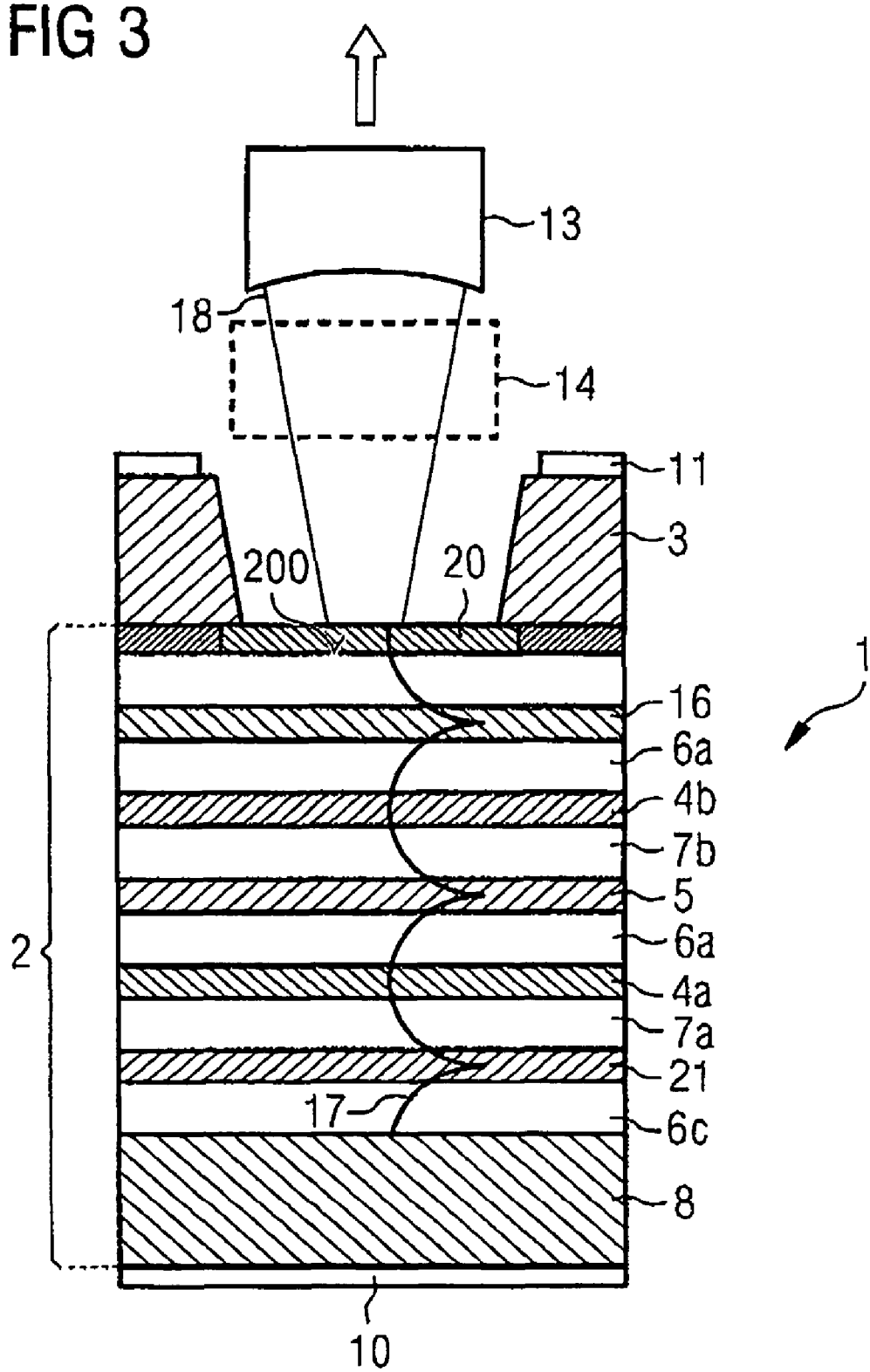

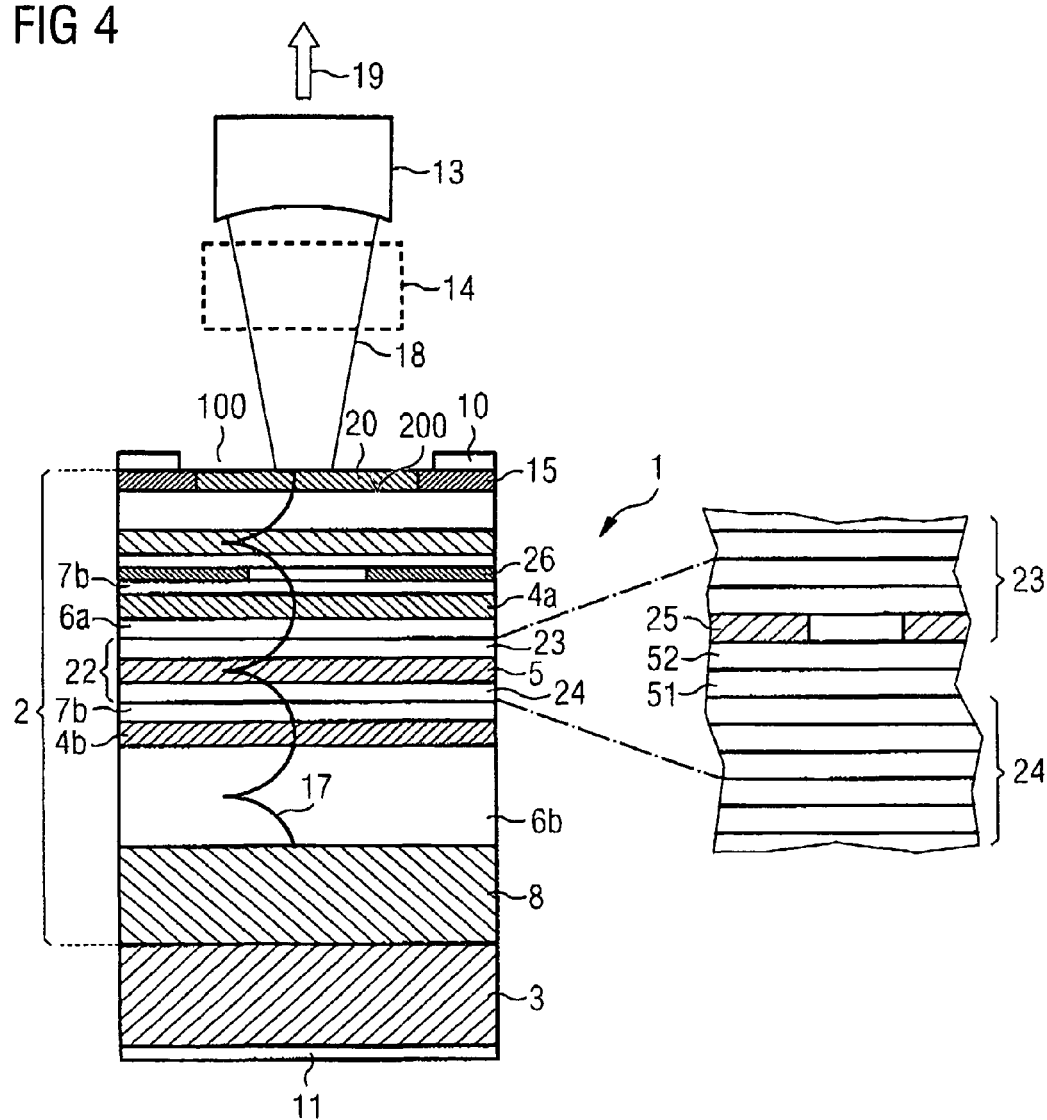

SURFACE EMITTING SEMICONDUCTOR COMPONENT, AND LASER DEVICE INCLUDING SUCH COMPONENT

RELATED APPLICATIONS

This patent application claims the priority of German patent applications 10 2005 058 009.2 filed Dec. 5, 2005 and 10 2006 010 728.4 filed Mar. 8, 2006 the disclosure content of both of which is hereby incorporated by reference.

FIELD OF THE INVENTION

The present invention relates to a radiation-emitting semiconductor component, and to a laser device.

BACKGROUND OF THE INVENTION

In the case of electrically operated radiation-emitting semiconductor components, the conversion efficiency, that is to say the ratio of radiation power generated in the component to the electrical power fed to the component by means of the operating current, is of considerable importance. Often only a comparatively small proportion of the electrical power fed in is converted into radiation power. The electrical power loss not converted into radiation power is converted into heat, for example, and is lost for the generation of radiation.

SUMMARY OF THE INVENTION

It is one object of the present invention to provide a semiconductor component which can be operated more efficiently in a simplified manner.

Another object of the invention is to provide an efficient laser device.

One embodiment of the invention is a surface emitting semiconductor component suitable for operation with an external resonator and having an emission direction, wherein the semiconductor component includes a semiconductor body which comprises a plurality of active regions that are adapted for generation of radiation and are spaced apart from one another and a tunnel junction monolithically integrated in the semiconductor body between two active regions from among said plurality of active regions, wherein the two active regions are electrically conductively connected by means of the tunnel junction during operation of the semiconductor component.

A semiconductor component of this type has the advantage that the radiation power generated in the semiconductor body and accordingly the radiation power coupled out from the semiconductor component can be increased in a simplified manner on account of the plurality of active regions. Moreover, it is possible to increase the conversion efficiency of charge carriers injected into the semiconductor body into radiation (photons) by means of the active regions electrically conductively connected via the tunnel junction. An electron which recombines in an active region with generation of radiation and in the process undergoes transition from the conduction band to the valence band in said active region can tunnel through the tunnel junction, which is embodied for example as a tunnel diode that is reverse-biased, particularly during operation of the semiconductor component in the forward direction with respect to the active regions, and can pass into the second active region. The tunnel junction is preferably formed in such a way that electrons tunnel from the valence band of one active region into the conduction band of the other active region and can thus in turn be utilized for the generation of radiation in the further active region. A charge carrier can thus be utilized multiply, that is to say in a plurality of active regions, for the generation of radiation.

Overall, with the electrical power fed to the component remaining the same, the radiation power generated in the semiconductor body and thus, in particular, also the radiation power coupled out from the semiconductor component can be increased in comparison with a semiconductor body with a smaller number of active regions. Furthermore, it is advantageously possible to increase the radiation power coupled out from the semiconductor component, in particular the semiconductor body, relative to the area contained in a radiation coupling-out area of the semiconductor body, which is preferably equal to that of a semiconductor body with only one active region. Consequently, the semiconductor component has increased conversion efficiency overall.

If in doubt, a vertical emission direction may in this case be understood to mean an emission direction essentially perpendicular to a surface, in particular a main area, of the active regions, which are preferably arranged parallel to one another in the semiconductor body.

A laser device according to an embodiment of the invention comprises a semiconductor component as described above and an external resonator formed by means of an external mirror assigned to the semiconductor component.

The external resonator, that is to say a resonator which is formed by means of at least one element spaced apart, e.g. by means of a clearance, from the semiconductor component, is particularly suitable for the generation of high radiation power and for a directional emergence of radiation from the resonator.

Moreover, one or a plurality of further elements may be arranged in a simplified manner in an external resonator compared with an internal resonator. Said elements, such as e.g. an etalon, may serve for, in particular longitudinal, mode selection.

It is preferred to form two active regions for the generation of radiation having the same wavelength. This may be achieved in a simplified manner by identical type of embodiment of the active regions, e.g. by means of identical materials and/or the same structural construction of the active regions.

In one preferred configuration, a frequency-converting, preferably a frequency-multiplying, particularly preferably a frequency-doubling element is arranged in the external resonator. An element of this type can be used to convert longwave into short-wave radiation, e.g. non-visible radiation, for instance infrared radiation, into visible radiation. A nonlinear optical element, e.g. a nonlinear crystal, is particularly suitable for frequency conversion, in particular for frequency doubling.

The semiconductor component is preferably formed for operation as an electrically pumped semiconductor laser component, in particular as a VECSEL (VECSEL: Vertical External Cavity Surface Emitting Laser) or else disk laser.

The external resonator of the semiconductor laser component may be formed by means of a first mirror and a second mirror, which preferably delimit the external resonator. In this case, one of the mirrors for the external resonator is embodied as an external mirror. The semiconductor component preferably has an internal mirror for forming the resonator. One of the resonator mirrors is therefore preferably embodied as an internal mirror.

During the operation of the semiconductor laser component with the resonator, a radiation field, in particular a field of standing waves (standing wave field), builds up in the resonator, which field can be amplified at least in part by stimulated emission in the active regions. This amplified radiation can couple out from the resonator as coherent laser radiation.

Two active regions of the semiconductor component are preferably provided as amplifying regions for joint operation within the external resonator. The resonator is particularly preferably formed as a common resonator for a plurality of active regions which are formed as amplifying regions and are arranged within the resonator. This relates in particular to the two active regions electrically conductively connected, preferably in series, via the tunnel junction. A plurality of amplifying regions in a common resonator facilitates the increase in the gain in the semiconductor body and, in addition, the operation of the component as a high-power component, in particular as a high-power semiconductor laser component, e.g. as a VECSEL.

Mirrors by means of which the resonator is formed are preferably formed with a high reflectivity, for example of 98% or greater, one of the mirrors, preferably an external mirror, which serves as a coupling-out mirror for coupling out radiation from the resonator, preferably having a correspondingly lower reflectivity. In this case, the reflectivity of the coupling-out mirror is expediently chosen with a magnitude such that laser activity can be achieved during operation of the component.

The radiation gain within the resonator and in particular the semiconductor body can be increased by means of a plurality of amplifying regions within a common resonator. On account of the increased gain, the threshold current required for achieving the laser activity, or the threshold current density, can be reduced, with the result that laser activity can already be established even for lower currents or current densities.

The reflectivity of a mirror by means of which the resonator is formed may alternatively or supplementarily be reduced, in which case laser activity can still reliably be achieved despite the reduced reflectivity on account of the increased gain by means of the plurality of active regions. In this case, the reflectivity of the mirror serving as a coupling-out mirror, e.g. of the external mirror, is expediently reduced, with the result that the radiation power coupled out from the resonator can be increased without a critical increase in the threshold current.

In a further preferred configuration, one of the mirrors by means of which the resonator is formed or delimited, in particular the internal mirror, is embodied as a Bragg mirror. This resonator Bragg mirror is furthermore preferably doped and/or monolithically integrated into the semiconductor body.

In one preferred configuration, a pump current for electrically pumping the semiconductor laser component flows through one of the mirrors by means of which the resonator is formed, in particular the internal mirror.

The electrical resistance of a mirror that conducts the pump current is distributed between the plurality of active regions on account of the plurality of active regions in a common resonator, thereby resulting in a reduction of the electrical resistance to be overcome by the pump current relative to the number of active regions in comparison with a semiconductor component of identical type with a smaller number of active regions.

This is of particular importance if the mirror that conducts the pump current is embodied as a Bragg mirror.

A Bragg mirror preferably comprises a plurality of layers stacked one on top of another, in particular semiconductor layers having different refractive indices. Said layers are preferably embodied in each case as a λ/4 layer for a radiation having the wavelength λ that is to be emitted by the semiconductor component, and in particular is to be amplified in the resonator.

For a Bragg mirror involved in forming the resonator, 50 or more semiconductor layers, for example, may be necessary in order to reliably achieve laser activity. The electrical resistance of a Bragg mirror generally increases with the number of layers on account of the rising number of interfaces. Therefore, a resonator Bragg mirror often has a comparatively high resistance. The resistance of a semiconductor component with a resonator Bragg mirror monolithically integrated into the semiconductor body may be critically determined by the electrical resistance of the Bragg mirror. Accordingly, on account of the high resistance of the mirror, on account of the power drop at the Bragg mirror in accordance with $P=RI^2$ with the resistance R, the electrical power P and the current I, the electrical pump power that is to be fed and is required for the laser activity is also increased since power drops at the Bragg mirror. On account of the plurality of active regions to which a common pump current can be fed via the tunnel junction and in particular the Bragg mirror, the resistance of the semiconductor component per active region is reduced in comparison with a semiconductor component with fewer active regions. The efficiency is thus increased overall.

In a further preferred configuration, a further tunnel junction is monolithically integrated in the semiconductor body between the resonator Bragg mirror and the active region closest to the latter. The Bragg mirror may thus be formed in a simplified manner with a predetermined conduction type—p-conducting or n-conducting, in which case further elements of the semiconductor body that are arranged between the tunnel junction and the active region closest to the Bragg mirror can advantageously be formed in a simplified manner in accordance with a standard process or a standard construction, in particular with a conduction type that is different from that of the Bragg mirror. By a suitable choice of the conduction types of the Bragg mirror, it is possible to reduce the absorption of radiation in the resonator, said absorption being effected by free charge carriers in the Bragg mirror. The radiation power available for the amplification in the active regions and thus the efficiency of the semiconductor component are consequently increased. An n-conducting Bragg mirror with a tunnel junction correspondingly connected downstream is particularly suitable for this on account of the often lower absorptivity of radiation by free charge carriers in comparison with a p-conducting Bragg mirror.

In a further preferred configuration, the resonator and/or the semiconductor component, in particular the semiconductor body, is formed in such a way that a radiation field that forms within the resonator during operation of the semiconductor component, and in particular is to be amplified in the semiconductor body, has an intensity node, that is to say a minimum in the intensity distribution of the standing wave field, within the tunnel junction that electrically conductively connects the two active regions. A mode of the radiation field that is to be amplified preferably has an intensity node within the tunnel junction. The resonator preferably has a predetermined resonator length, with the result that the semiconductor body is formed for the predetermined resonator length in such a way that an intensity node is arranged within the tunnel junction.

In a tunnel junction, the absorptivity of radiation, on account of free charge carriers, is generally particularly high. By means of an arrangement of the tunnel junction around or in an intensity node, it is possible to reduce or completely avoid the absorption of radiation power in the tunnel junction.

In a further preferred configuration, a tunnel junction, in particular the tunnel junction arranged between the two active regions or a tunnel junction connected downstream of the resonator Bragg mirror, has two, in particular doped, tunnel semiconductor layers of different conduction types.

The tunnel junction is preferably arranged in the semiconductor body between two semiconductor layers of different conduction types, in particular said semiconductor layers adjoining the tunnel junction. Furthermore, one tunnel semiconductor layer preferably has, and particularly preferably two tunnel semiconductor layers have, a dopant concentration greater than that of a layer of the respective same conduction type that adjoins the tunnel junction. The electrically conductive connection of the two active regions may thus be embodied with a low electrical resistance in a simplified manner.

In a further preferred configuration, a frequency-selective element is formed in the semiconductor body. The frequency-selective element may be formed for the targeted modulation of the local intensity distribution in the resonator. The frequency-selective element is preferably formed in such a way that only a comparatively low intensity can occur in a region of the resonator and in particular of the semiconductor body, outside the active regions, which has a disadvantageously high absorptivity for radiation from the radiation field by means of which the radiation power available for amplification would be reduced. In particular, the envelope curve of the intensity distribution of the radiation field, in particular the envelope curve of the intensity distribution of a mode of the standing wave field that is to be amplified, can be shaped and modified in a targeted manner in the resonator by means of the frequency-selective element.

As an alternative or in addition, the frequency-selective element may be formed for, in particular longitudinal, mode selection. The selection of a predetermined mode that is to be amplified in the resonator can thereby be simplified. In this case, the frequency-selective element preferably increases the losses for modes that are not to be amplified in the resonator.

In a further preferred configuration, the frequency-selective element is arranged between two active regions of the semiconductor body. Furthermore, the frequency-selective element may be monolithically integrated in the semiconductor body. In particular, the frequency-selective element may already have been grown epitaxially with a frequency-selective property. Additional modifications after the epitaxy are not necessary.

In a further preferred configuration, the frequency-selective element is embodied in such a way that the intensity of radiation is reduced within the frequency-selective element, particularly in comparison with dispensing with the frequency-selective element.

The frequency-selective element may comprise a Bragg mirror and preferably a further Bragg mirror. The Bragg mirror(s) is (are) preferably doped, thereby facilitating the pump current conduction through the Bragg mirror(s). The Bragg mirrors particularly preferably have different conduction types.

Furthermore, the frequency-selective element is preferably free of an active region arranged within said element.

By means of the frequency-selective element, additional phase conditions are created, in particular by means of reflection at the Bragg mirrors, for the radiation field in the semiconductor body. The intensity of the radiation field can be reduced in a simplified manner between the Bragg mirrors of the frequency-selective element by means of reflection at said mirrors. In particular, this relates to a lowering of the envelope curve of the intensity distribution of the radiation field in the semiconductor body between the active regions and, in particular, within the frequency-selective element in comparison with a semiconductor body without a frequency-selective element.

The envelope curve of the intensity distribution may have a local minimum between the active regions—in particular those between which the frequency-selective element is arranged—, within the frequency-selective element, between the Bragg mirrors of the element and/or in the region of the tunnel junction.

As an alternative or in addition, a local maximum of the envelope curve may be shifted in a targeted manner, e.g. to outside the region between two active regions, by means of the frequency-selective element.

The tunnel junction that electrically conductively connects the active regions is preferably surrounded by the frequency-selective element or embedded in the latter. On account of the radiation intensity that can be reduced within the frequency-selective element, only a comparatively low radiation power can be absorbed in the tunnel junction.

In the case, too, where the tunnel junction is arranged outside an intensity node, the radiation power that can be absorbed in the tunnel junction can thereby be kept within a tenable scope in a simplified manner, in particular without the laser properties of a semiconductor laser component being critically impaired. It is thus possible, by way of example, to avoid or reduce in a simplified manner an increase in the threshold current despite an absorbent tunnel junction that electrically couples the active regions to one another. In the arrangement of the tunnel junction or the production of the semiconductor body, which is preferably grown epitaxially on a growth substrate, the manufacturing tolerance is thus increased without a significant reduction of the efficiency. The region between the Bragg mirrors of the frequency-selective element is preferably free of an active region.

The semiconductor component accordingly preferably has, in addition to a Bragg mirror involved in the formation of the resonator, at least one, preferably two, further Bragg mirrors monolithically integrated in the semiconductor body.

The frequency-selective element is expediently formed in such a way that the semiconductor laser component is free of a subresonator, that is to say free of an active region that has a resonator that is separate in relation to a further active region and achieves laser activity. For this purpose, the Bragg mirror(s) of the frequency-selective element is (are) expediently formed with reflectivities low enough to prevent a build-up of oscillations of laser modes in a subresonator for an active region.

In one preferred configuration, the Bragg mirror and/or the further Bragg mirror for this purpose has a reflectivity of 95% or less, preferably 90% or less, particularly preferably 80% or less, in particular for the radiation having the wavelength $\lambda$ that is to be amplified in the active regions. The build-up of oscillations of subresonator modes can thus be reduced in a simplified manner. The reflectivity of the Bragg mirror and/or of the further Bragg mirror is furthermore preferably greater than 30%, particularly preferably greater than 40%. Such reflectivities are particularly suitable for the intensity modulation. The lower the reflectivity of the individual mirrors, the lower, too, the risk of the build-up of oscillations of sub-modes. The greater the reflectivity, the better, however, it is possible to influence the intensity distribution.

The tunnel junction is particularly advantageously arranged between the Bragg mirrors of the frequency-selective element.

In a further preferred configuration, between two active regions a current constriction element is arranged in the semiconductor body. The current constriction element is preferably arranged or integrated in the frequency-selective element, in particular in a Bragg mirror of said element. A current flow in the semiconductor body can be guided by means of an electrically insulating current blocking region of the current constriction element laterally in the direction of an electrically conductive, current-carrying aperture of the current constriction element and be conducted in the vertical direction through said aperture. By means of the current constriction element, the current flow is concentrated in the lateral direction and, in particular, the current path is constricted. A threshold current density for the laser activity can thus be achieved in a simplified manner. If appropriate, said current constriction element may be provided in addition to a further current constriction element, e.g. embodied in a corresponding manner, which is preferably arranged between a surface of the semiconductor body and the active region closest to said surface. A lateral current spreading in the semiconductor body and in particular also between the active regions can thus advantageously be counteracted. The current constriction element may be embodied as an oxide constriction element having a semiconductor layer with an oxidized current blocking region and a non-oxidized current passage region that may form the aperture.

In a further preferred configuration, the resonator or the semiconductor component, in particular the semiconductor body, is formed in such a way that an active region is arranged in a targeted manner outside an intensity maximum of the radiation field in the resonator in such a way that said intensity maximum lies within an n-conducting semiconductor region of the semiconductor body that preferably adjoins the active region, or is shifted in the direction thereof. This can be achieved in a simplified manner by forming the resonator or the semiconductor body in a suitable manner. The intensity maximum is preferably the intensity maximum closest to the active region.

In particular, for this purpose, a p-conducting semiconductor region arranged on that side of the active region which is remote from the n-conducting semiconductor region may be formed thinner in a targeted manner. For a predetermined resonator length, an, if appropriate further, n-conducting semiconductor region of the semiconductor body is in this case preferably made correspondingly thicker. The total thickness of the semiconductor body can thus remain unchanged in a simplified manner despite the n-conducting semiconductor region made thicker. The absorption of radiation at free charge carriers is often greater in a p-conducting semiconductor material than in an n-conducting semiconductor material, so that the absorption of radiation is reduced by increasing in a targeted manner the thickness of the n-conducting semiconductor region at the expense of that of the p-conducting semiconductor region.

In a further preferred configuration, two active regions of the semiconductor component comprise a quantum well structure. A quantum well structure, such as a single or, in particular, a multiple quantum well structure, is distinguished by high internal quantum efficiency in the conversion of electrical power into radiation power. The conversion efficiency of the semiconductor component can thus be increased more extensively. In particular, the designation quantum well structure in this case does not comprise any indication about the dimensionality of the quantization. It therefore encompasses, inter alia, quantum wells, quantum wires and quantum dots and any combination of these structures.

In a further preferred configuration, the semiconductor body, in particular the tunnel junction, the active regions, the internal mirror, the current constriction element and/or the frequency-selective element, contains, in particular in each case a III-V semiconductor material, in particular a material from the III-V semiconductor material systems $In_xGa_yAl_{1-x-y}P$, $In_xGa_yAl_{1-x-y}N$ and/or $In_xGa_yAl_{1-x-y}As$, in each case where $0 \leq x \leq 1$, $0 \leq y \leq 1$ and $x+y \leq 1$, and/or a material from the semiconductor material systems InGaAsN, InGaAsSb, InGaAsSbN or $In_xGa_{1-x}As_yP_{1-y}$, where $0 \leq x \leq 1$ and $0 \leq y \leq 1$, where in each case $x \neq 0$ and/or $y \neq 0$ preferably holds true for the specified parameters x and y. It is furthermore preferably the case that $x \neq 1$ and/or $y \neq 1$. III-V semiconductor materials may be distinguished by particularly high quantum efficiencies in the generation of radiation and simplified producibility of a semiconductor body for the semiconductor component. With the material systems mentioned, radiation in different spectral ranges can be generated particularly efficiently. In this case, $In_xGa_yAl_{1-x-y}N$ is particularly suitable for ultraviolet radiation through blue to green radiation, $In_xGa_yAl_{1-x-y}P$ is particularly suitable for yellow to red radiation, and $In_xGa_yAl_{1-x-y}As$ is particularly suitable for infrared radiation.

BRIEF DESCRIPTION OF THE DRAWINGS

FIG. 3 shows a schematic sectional view of a third exemplary embodiment of a semiconductor component according to the invention, FIG. 4 shows a schematic sectional view of a fourth exemplary embodiment of a radiation-emitting semiconductor component according to the invention.

DETAILED DESCRIPTION OF THE DRAWINGS

Elements that are identical, of identical type and act identically are provided with identical reference symbols in the figures.

Figure 1:
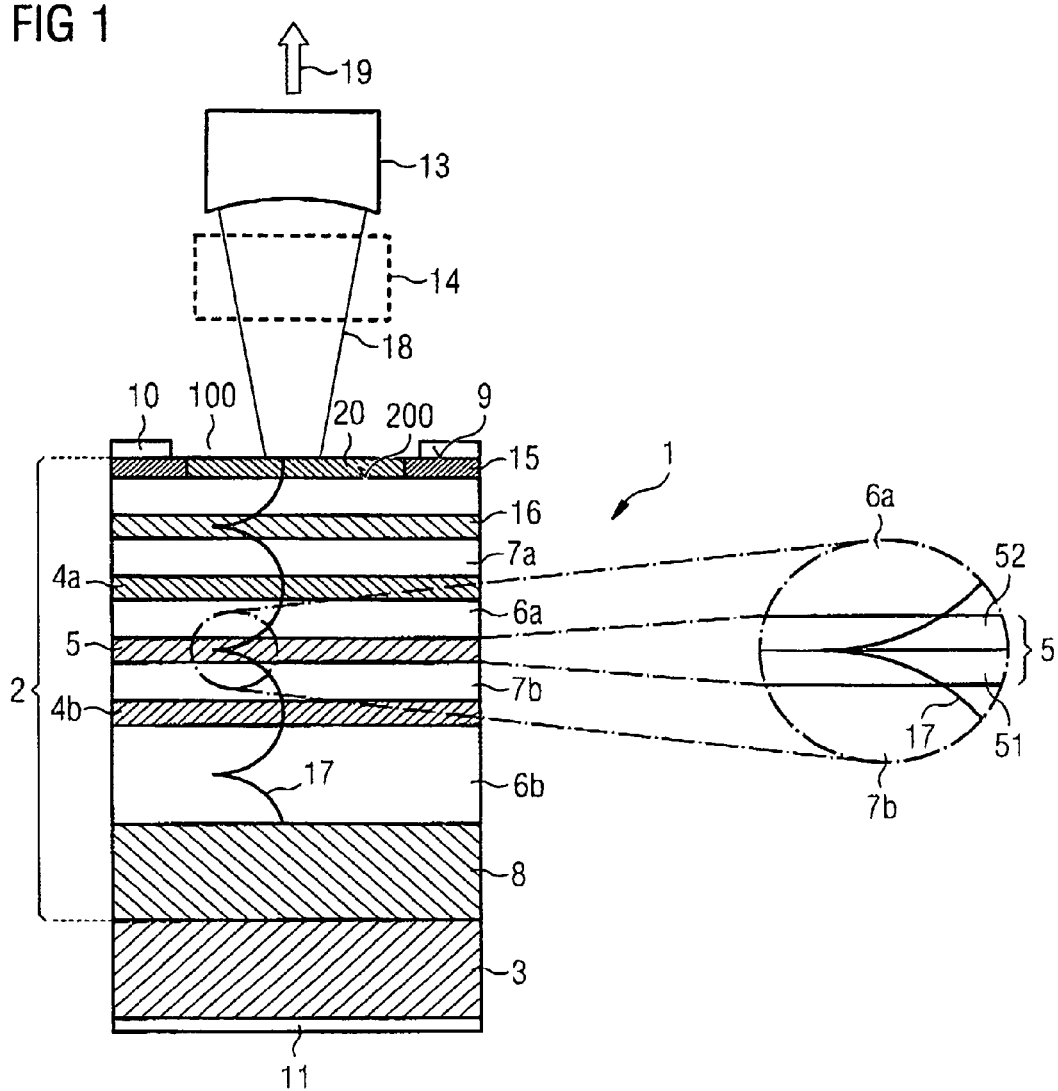
FIG. 1 shows a schematic sectional view of a first exemplary embodiment of a semiconductor component according to the invention.

FIG. 1 shows a schematic sectional view of a first exemplary embodiment of a semiconductor component according to the invention.

The semiconductor component 1 comprises a semiconductor body 2 arranged on a substrate 3. The substrate 3 mechanically stabilizes the semiconductor body and may comprise or be formed from the growth substrate on which a semiconductor layer sequence for the semiconductor body is grown epitaxially.

The semiconductor body is preferably based on (In,Al)GaAs or, in particular, on (Al)GaAs. (Al)GaAs is particularly suitable for an efficient radiation-emitting semiconductor component, in particular for the generation of radiation in the infrared spectral range. An, e.g. n-conducting, GaAs substrate is particularly suitable as the substrate 3, in particular as the growth substrate, for this material system.

The semiconductor body 2 is preferably embodied in monolithically integrated fashion and comprises two active regions 4a and 4b which are arranged in a manner vertically spaced apart from one another in the semiconductor body and preferably in an adjacent manner in the semiconductor body, are suitable for generation of radiation and are electrically conductively connected in a series circuit via a tunnel junction 5 arranged between said active regions.

The active regions 4a and 4b are in each case arranged between two semiconductor regions 6a and 7a and, respectively, 6b and 7b, the regions 6a and 7a and, respectively, 6b and 7b particularly preferably having different conduction types. The semiconductor regions 6a and 6b and, respectively, 7a and 7b preferably in each case have the same conduction type. The semiconductor regions 6a and 7b arranged between the active regions 4a and 4b furthermore preferably adjoin the tunnel junction 5.

Between the active regions and the substrate 3, a, preferably doped, e.g. n-conducting, Bragg mirror 8 is monolithically integrated in the semiconductor body 2. The Bragg mirror 8 preferably adjoins the substrate.

Via contacts electrically conductively connected to the active regions—a first contact 10 and a second contact 11—, during operation of the semiconductor component a pump current is conducted to the active regions 4a and 4b, in which radiation, for example infrared radiation, is consequently generated by recombination of electrons and holes.

The first contact 10, for example a metallization, is preferably arranged on the surface 9 of the semiconductor body 2, said surface 9 being remote from the substrate 3. The first contact is preferably embodied as an annular contact. The second contact 11, for example a metallization, is preferably arranged on the substrate on that side of the substrate 3 which is remote from the semiconductor body 2.

The elements of the semiconductor body that are arranged between the first contact 10 and the active region 4a closest to the latter preferably have the same conduction type, for example p-conducting. The same correspondingly holds true for the elements arranged between the second contact 11 and the active region 4b closest to the latter. These elements are preferably embodied in n-conducting fashion.

The Bragg mirror 8 forms, together with an external mirror 13, a common external optical resonator for the two active regions 4a and 4b of the semiconductor component.

A radiation field builds up in the resonator during operation of the semiconductor component, and can be amplified by stimulated emission in the active regions. The normalized profile of the intensity 17 of the standing wave field 18 to be amplified by stimulated emission in the active regions is illustrated schematically in FIG. 1. The semiconductor component with the external resonator is thus embodied in particular as an electrically pumped VECSEL or semiconductor disk laser. On account of the plurality of active amplifying regions arranged in the common resonator, the threshold current required for achieving the laser activity or the threshold current density can be reduced. In addition, the conversion efficiency of electrical pump power into radiation power is increased.

As an alternative or in addition, it is possible to reduce the reflectivity of the mirrors 8 or 13 that is required for achieving the laser activity, in particular the reflectivity of the external mirror 13 serving as a coupling-out mirror in the present case, so that, for the same radiation coupling-out area, an increased radiation power can be coupled out from the resonator without attainment of the laser activity being made critically more difficult.

Since a plurality of active regions are available for amplifying radiation in a common resonator, the gain is increased and at the same time there is a reduction of the resistance per amplifying region in the semiconductor body. The number of radiation circulations in the resonator can thus be reduced, whereby it is possible to reduce the absorption of radiation power in the semiconductor body outside the active regions.

Overall, it is thus possible to increase the differential efficiency $dP_{opt}/dI$, with the coupled-out radiation power $P_{opt}$ and the injected current I, and/or the differential gain $dg/dn$, with the gain g and the charge carrier density n.

In addition, the modulation properties of the semiconductor component can be improved. By way of example, it is possible to reduce the minimum pulse interval that can be obtained in pulsed operation of the component. Projection applications require particularly small pulse intervals, with the result that a reduction of the pulse intervals that can be obtained is of particular importance for a projection application for which the semiconductor component may be provided. For this purpose, the resonator length is preferably additionally chosen to be correspondingly short since smaller pulse intervals can be obtained with shorter resonator length in a simplified manner. The resonator length is preferably less than or equal to 30 cm, particularly preferably less than or equal to 10 cm.

The external mirror 13 is preferably formed as a coupling-out mirror for coupling out radiation from the resonator. For the radiation having the wavelength λ that is to be amplified in the active regions, the external mirror preferably has a reflectivity of 95% or more, particularly preferably 97% or more, for example 99% or more.

The reflectivity of the Bragg mirror 8, which preferably does not serve as the coupling-out mirror in the present case, is preferably greater than or equal to the reflectivity of the external mirror.

The Bragg mirror 8 preferably has a multiplicity of semiconductor layers, for example 55 or more semiconductor layers, having different refractive indices. These are preferably based in each case on (Al)GaAs. Such a high number of layers is often necessary for obtaining a predetermined reflectivity that suffices for achieving the laser activity, e.g. 99.9% or greater. The semiconductor layers of the Bragg mirror 8 are furthermore preferably in each case embodied as λ/4 layers for radiation having the wavelength λ that is to be amplified in the active regions 4a and 4b.

In order to reduce the number of layers in the Bragg mirror with the reflectivity remaining the same, materials having advantageously a high refractive index difference, for instance AlAs and GaAs, are preferably used for the various semiconductor layers of the Bragg mirror. The Bragg mirror may comprise semiconductor layer pairs comprising individual layers having different refractive indices which are arranged alternately in such a way that a layer having a high refractive index is followed by a layer having a low refractive index. It is possible alternatively or supplementarily to use mirror structures in which one or a plurality of λ/4 layers have a material gradient, for example a gradient in the Al content.

On account of the multiplicity of layers, the Bragg mirror 8 makes a high contribution to the total electrical resistance of the semiconductor body 2. Since, on account of the plurality of active regions, the resistance of the Bragg mirror is distributed between said regions, it is possible to increase the conversion efficiency of the semiconductor component 1 of electrical power into radiation power in comparison with a component comprising only one active region in an external resonator. The semiconductor component is thus suitable for the emission of particularly high radiation power.

As an alternative, it is also possible for the pump current not to be conducted via the resonator Bragg mirror 8 or the substrate 3 to the active regions. For this there is a so-called intra-cavity contact, that is to say a contact by means of which current is injected into the semiconductor body within the resonator, in particular between a resonator mirror, for instance the Bragg mirror, and the active region closest to the latter. The resistance to be overcome by the pump current can thus be reduced. The Bragg mirror 8 may then be embodied in undoped fashion, if appropriate. As an alternative, it is also possible to use an electrically insulating dielectric mirror layer stack, which is preferably formed on the semiconductor body, as resonator mirror.

A nonlinear optical element 14, e.g. a BiBo crystal (BiBo: bismuth triborate, e.g. $BiB_3O_6$) for frequency multiplication, in particular for frequency doubling, is preferably arranged in the external resonator.

Non-visible radiation, e.g. infrared radiation, amplified by stimulated emission in the active regions can be converted into visible radiation by frequency multiplication in the nonlinear optical element, said visible radiation coupling out from the resonator.

A semiconductor contact layer 15 may be formed between the first contact 10, which is preferably embodied as an annular contact for the passage of radiation, and the active regions, said semiconductor contact layer in the present case preferably being formed in annular fashion and/or adjoining the first contact. From the first contact 10, charge carriers pass via the semiconductor contact layer and subsequently a current spreading layer 16 to the active regions. The current spreading layer 16 preferably has an advantageously high conductivity in the lateral direction, so that charge carriers in the current spreading layer are conducted in the lateral direction away from the edge of the semiconductor body in the direction of the centre of the semiconductor body. A (Al)GaAs layer having an Al content of 70% or greater is particularly suitable as the current spreading layer. The risk of nonradiative recombination, which is particularly high in an edge region of the semiconductor body 2, can thus be reduced.

Charge carriers which recombine radiatively in one of the active regions can pass into the other active region after tunneling through the tunnel junction 5. The tunnel junction is preferably formed in such a way that charge carriers can tunnel from the valence band of one active region into the conduction band of the other active region and recombine radiatively again in the latter. The conversion efficiency of the semiconductor component is thus advantageously increased.

The tunnel junction 5 is preferably embodied as a diode that is reverse-biased during operation of the semiconductor component, in particular with respect to the contacts 10 and 11.

The tunnel junction comprises for example two tunnel layers 51 and 52 of different conduction types. The tunnel layer 52 preferably has the same conduction type, in particular n-conducting, as a semiconductor layer from the semiconductor region 6a, said semiconductor layer adjoining the tunnel junction 5 on the side of the tunnel layer 52, that is to say at that side of the tunnel layer 52 which is remote from the tunnel layer 51. The tunnel layer 52 particularly preferably has a higher dopant concentration (e.g. $n^+$) than said adjoining semiconductor layer of the semiconductor region 6a. The same correspondingly holds true for the tunnel layer 51 (e.g. $p^+$) with respect to an, in particular p-conducting, semiconductor layer of the semiconductor region 7b, said semiconductor layer adjoining the tunnel junction 5 on the side of said tunnel layer 51.

The tunnel layers 51, 52 preferably have in each case a thickness of 30 nm or less, particularly preferably 20 nm or less. The tunnel layers 51 and 52 may have a dopant concentration of, for example, $5 \times 10^{19}$ cm$^{-3}$ or more, preferably of $1 \times 10^{20}$ cm$^{-3}$ or more. (Al)GaAs layers having an Al content of 20% or less are particularly suitable for the respective tunnel layer.

The resonator length is preferably $n*(\lambda/2)$, where $\lambda$ denotes the wavelength of the radiation to be amplified and n denotes a natural number. n is preferably greater than or equal to 3. n is furthermore preferably chosen in such a way that the resonator length is less than or equal to $6\lambda$ per active region of the semiconductor component.

Via an aperture 100 in the contact 10, said aperture being embodied for example like a circle or ellipse, radiation, after emerging from the semiconductor body 2 via an emission surface 200 of the semiconductor body, can pass through the cut-out region of the contact 10. At the external mirror 13, said radiation is at least partly reflected back into the semiconductor body 2 for more extensive amplification in the active regions.

The polarization of the emerging radiation can be influenced by means of the shaping of the aperture. A cutout in the contact 10 that is elliptical when seen in plan view is particularly suitable for this purpose.

In order to reduce the reflection losses when the radiation enters into the semiconductor body again, on the emission surface 200 of the semiconductor body 2 an antireflection layer or coating 20 is preferably applied to the semiconductor material, e.g. in an aperture of the contact 10 and/or the semiconductor contact layer 15.

The elements of the semiconductor body 2 which are arranged within the resonator, that is to say all the semiconductor elements apart from the Bragg mirror, may—apart from the active regions 4a and 4b—have the same material composition apart from, if appropriate, different conduction types and/or dopant concentrations. In particular, the tunnel junction 5 and the adjoining semiconductor regions may have the same composition apart from the dopant concentration. Refractive index discontinuities within these elements in the common resonator with accompanying increased reflection at interfaces can thus be reduced.

As an alternative, different materials in each case may be used for the elements arranged within the resonator, that is to say in particular for the tunnel junction and the adjoining semiconductor regions 6a and 7b. The degrees of freedom for the formation of these elements are thus increased.

Combinations of such identical type of formation and different formation of the individual semiconductor elements in the resonator are also possible. By way of example, all elements between the Bragg mirror 8 and the tunnel junction 5, if appropriate including the tunnel junction,—apart from the active region arranged there—may have the same material composition. The elements of the semiconductor body 2 which are arranged between the tunnel junction 5 and the external mirror 13 may have different material compositions.

The semiconductor component 1 illustrated in FIG. 1 is formed as a top emitter. This means that radiation leaves the semiconductor body 2 via that side of the latter which is remote from the substrate 3. That surface of the semiconductor body which is remote from the substrate thus serves as emission surface 200 of the semiconductor component which emits vertically with respect to the active regions 4a and 4b.

Furthermore, the active regions are preferably formed in an identical way, in particular with identical materials and/or the same structural construction. The active regions may be embodied for generating radiation having identical (peak) wavelengths.

The active regions preferably each comprise a single or multiple quantum well structure. These structures are distinguished by particularly high internal quantum efficiencies in the conversion of electrical power into radiation power. The radiation gain in the semiconductor body relative to the charge carrier density can thus be increased in a simplified manner.

The active regions 4a and 4b are furthermore preferably arranged in each case in an intensity antinode, that is to say an intensity maximum, of the intensity distribution 17 of the standing wave field in the resonator. A particularly high radiation power is then available for amplification in the amplifying regions.

As an alternative or in addition, one or a plurality of active regions may also be arranged in a targeted manner outside an intensity antinode. By this means, it is possible to reduce the thickness of a p-conducting semiconductor region, particularly in regions having a comparatively high intensity, in the semiconductor body. In a p-conducting region, the absorption of radiation by free charge carriers is generally particularly great, and in particular greater than in an n-conducting region. This holds true in particular in the AlGaAs material system. The respective active region is then preferably arranged offset with respect to the closest intensity antinode in such a way that the intensity maximum closest to the active region is shifted in the direction of an n-conducting semiconductor region or lies in the latter. For this purpose, the respective n-conducting region, e.g. the region 6b, is made correspondingly thicker at the expense of a p-conducting region that is made thinner. By this means, too, the efficiency of the semiconductor component can advantageously be increased despite the arrangement of the active region outside an intensity antinode, since radiation in the resonator has a shorter passage through p-conducting semiconductor material. In this case, the resonator length preferably remains unchanged.

The highly absorbent tunnel junction that does not serve for amplification is preferably arranged in an intensity node of the intensity distribution 17 of the standing wave field in the resonator. The radiation power that can be absorbed in the tunnel junction 5 can thus be minimized. This arrangement contributes to increasing the efficiency of the semiconductor component.

Figure 2:
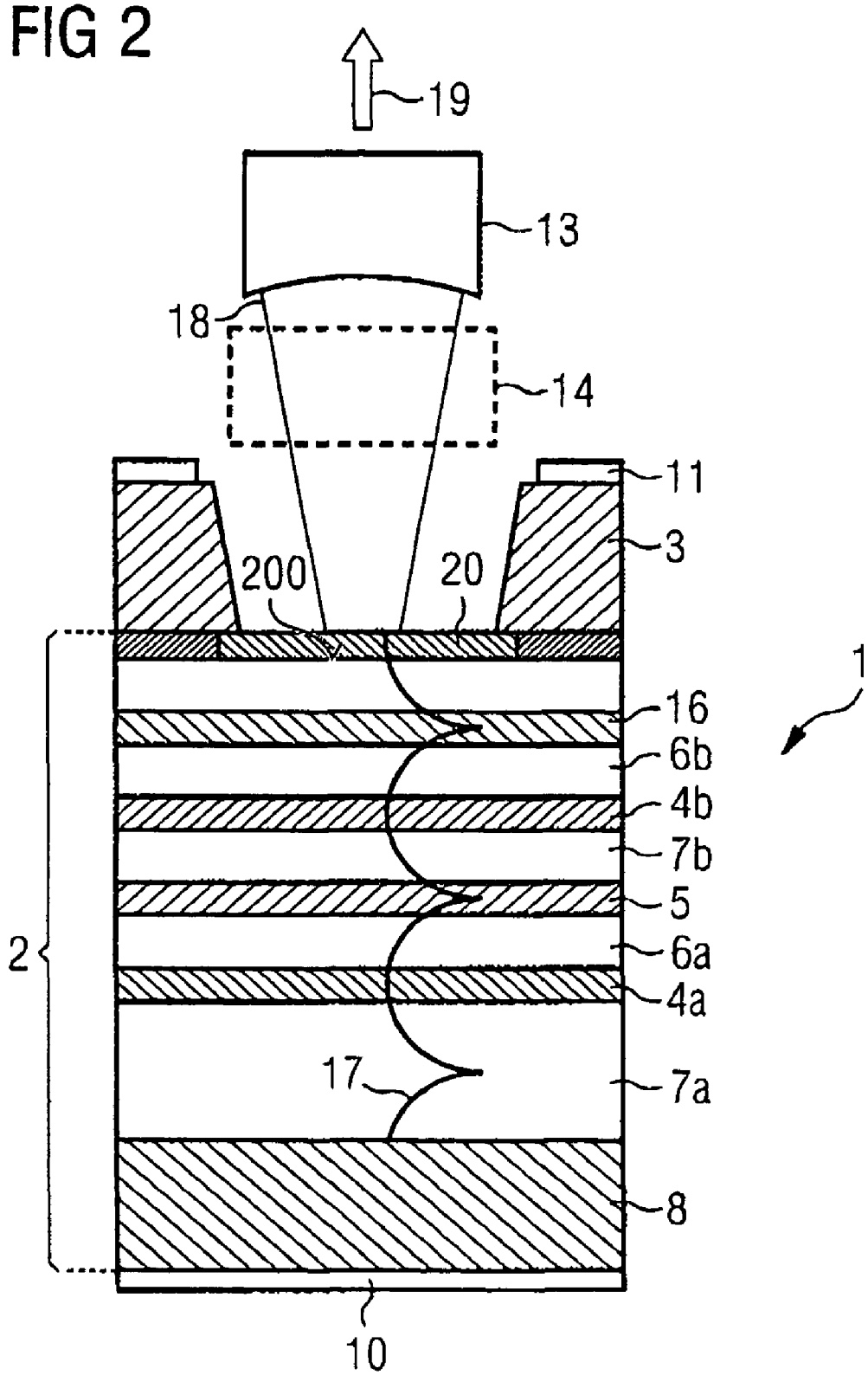
FIG. 2 shows a schematic sectional view of a second exemplary embodiment of a semiconductor component according to the invention.

FIG. 2 shows a schematic sectional view of a second exemplary embodiment of a semiconductor component according to the invention.

The exemplary embodiment according to FIG. 2 essentially corresponds to that shown in FIG. 1. In contrast thereto, the semiconductor component 1 in accordance with FIG. 2 is embodied as a bottom emitter. The emission surface 200 of the semiconductor component is accordingly formed by that surface of the semiconductor body 2 which faces the substrate 3. The substrate 3 and the second contact 11 are expediently correspondingly cut out for this purpose. The antireflection layer or coating 20 is applied on the semiconductor body 2 through an aperture of the contact 11 and the substrate 3. Furthermore, in contrast to the exemplary embodiment in accordance with FIG. 1, the Bragg mirror 8 is preferably embodied with a different conduction type, for example p-conducting, particularly if the substrate comprises the growth substrate. In this case, firstly n-conducting semiconductor material is advantageously grown on the substrate in accordance with a standard process. In addition, in contrast to the exemplary embodiment according to FIG. 1, the current spreading layer 16 is arranged between the second contact 11 and the active region 4b. The current spreading layer 16 is preferably embodied in n-conducting fashion.

FIG. 3 shows a schematic sectional view of a third exemplary embodiment of a semiconductor component according to the invention.

The semiconductor component essentially corresponds to that shown in FIG. 2 and, in particular, is also embodied as a bottom emitter. In contrast to the exemplary embodiment in accordance with FIG. 2, in the semiconductor body 2, in addition to the tunnel junction 5 arranged between the active regions 4a and 4b, a further tunnel junction 21 is monolithically integrated in the semiconductor body 2.

Said tunnel junction 21 is arranged between the Bragg mirror 8 and the active region 4a closest to the latter. On account of the additional tunnel junction, a Bragg mirror 8 having the opposite conduction type of the semiconductor region 7a can be used in a simplified manner. The Bragg mirror may thus be embodied in particular in n-conducting fashion. The same correspondingly holds true for the semiconductor region 6c that may be arranged between the Bragg mirror and the tunnel junction 21. In an n-conducting Bragg mirror 8, the absorption of radiation by free charge carriers is advantageously reduced in comparison with a p-conducting Bragg mirror with the result that the conversion efficiency of the component is advantageously increased in comparison with the component shown in FIG. 2. The tunnel junction 21 is preferably arranged in an intensity node of the intensity distribution 17, in the same way as the tunnel junction 5.

The tunnel junction 21 ensures a good electrical linking of the first contact 10 via the Bragg mirror 8 and the semiconductor region 6c, which preferably has the same conduction type as the Bragg mirror 8, to the semiconductor region 7a, which preferably has a different conduction type from that of the semiconductor region 6c and/or that of the Bragg mirror 8.

FIG. 4 shows a schematic sectional view of a fourth exemplary embodiment of a radiation-emitting semiconductor component according to the invention. The exemplary embodiment shown in FIG. 4 essentially corresponds to that shown in FIG. 1. In contrast thereto, a frequency-selective element 22 is monolithically integrated in the semiconductor body 2.

Furthermore, in the semiconductor body, preferably between the first contact 10 and the active region 4a closest to the latter, a current constriction element 26 is formed in the semiconductor body. The current constriction element 26 is preferably embodied as an oxide constriction element. For this purpose, by way of example, an (Al)GaAs layer having a high aluminum content, preferably 80% or greater, is oxidized laterally, with the result that a non-oxidized region having a high conductivity is formed in a central region and an, in particular annular, oxidized region having low conductivity is formed in the edge region of the semiconductor body 2. The current flow in the semiconductor body can thus be concentrated on the central region of the semiconductor body, as a result of which a threshold current density is achieved in a simplified manner and there is also a reduction of the risk of nonradiative recombination in edge regions of the semiconductor body.

Instead of decreasing the electrical conductivity of a semiconductor region for a current constriction element by means of oxidation, a current constriction element can also be formed by means of electrical spoiling by implantation, e.g. proton implantation, in the semiconductor body. In order to laterally limit the current flow in the semiconductor body, the semiconductor body may furthermore also be patterned in a region by means of etching into a reduced lateral dimension suitable for the respective threshold current density (mesa etching). The lateral current limiting can also be supported or obtained by means of a measure of this type.

The frequency-selective element 22 preferably comprises a first Bragg mirror 23 and a second Bragg mirror 24. The two Bragg mirrors 23 and 24 are preferably doped, the Bragg mirror 23 particularly preferably having the same conduction type as the semiconductor region 6a, for example n-conducting, and the Bragg mirror 24 particularly preferably having the same conduction type as the semiconductor region 7b, for example p-conducting. The tunnel junction 5 is arranged between the two Bragg mirrors of the frequency-selective element and, in particular, adjoins said mirrors. By means of the Bragg mirrors of the frequency-selective element, it is possible to modulate the intensity distribution in the semiconductor body in a targeted manner, so that the envelope curve of the intensity distribution of the intensity profile 17, which is illustrated only in normalized fashion here, has a local minimum between the active regions, in particular in the region of the tunnel junction. A reflectivity of the Bragg mirrors of the frequency-selective element of 30% or more, preferably of 40% or more, for radiation having the wavelength $\lambda$ that is to be amplified in the resonator is particularly suitable for this.

In this way, the radiation power available for absorption in the tunnel junction can advantageously be reduced. In the formation of the semiconductor body, the manufacturing tolerance is thus advantageously increased since even an arrangement of the tunnel junction slightly outside an intensity node does not lead to a critical increase in the absorbed radiation power.

In order to prevent the formation of separate subresonators that enable the laser activity to be obtained by means of amplification in individual active regions, the Bragg mirrors of the frequency-selective element preferably have a reflectivity of 95% or less, preferably of 90% or less, particularly preferably of 80% or less, for radiation having the wavelength $\lambda$ that is to be amplified in the resonator.

The individual layers of the respective Bragg mirror of the frequency-selective element may alternatively or supplementarily also be formed as $\lambda_1/4$ layers for radiation having a wavelength $\lambda_1$ which deviates from the wavelength $\lambda$ of the radiation which is to be amplified by means of the resonator and for which the resonator Bragg mirror 8 is expediently formed in highly reflective fashion. This deviation may amount to up to 10%.

Furthermore, the frequency-selective element may alternatively or additionally serve for longitudinal mode selection. Longitudinally monomode operation of the semiconductor laser component can thus be supported.

Furthermore, a further current constriction element 25 is preferably integrated in the, in particular p-conducting, Bragg mirror 23, said further current constriction element particularly advantageously having the same material as the current constriction element 26 and/or adjoining a tunnel layer 52 of the tunnel junction 5. Between the active regions as well, it is thus possible for the current flow to be constricted to the central region of the semiconductor body in a simplified manner. An identical type of embodiment of the two current constriction elements 25 and 26, for instance by means of semiconductor layers having an identical composition, facilitates the formation of oxide constriction elements with current-conducting apertures of identical size that preferably mutually overlap one another laterally, since identical materials generally have identical oxidation rates.

Furthermore, in contrast to the illustration, an intensity node may be arranged within the respective current constriction element since a current constriction element, in particular an oxide constriction element, may also have a critical absorptivity.

The scope of protection of the invention is not limited to the examples given hereinabove. The invention is embodied in each novel characteristic and each combination of characteristics, which particularly includes every combination of any features which are stated in the claims, even if this feature or this combination of features is not explicitly stated in the claims or in the examples.

In particular, the invention is not to be regarded as restricted to a semiconductor component comprising only two active regions. Rather, it is also possible to provide a larger number of active regions, in particular in a common resonator. These active regions are preferably electrically conductively connected in series in each case in pairs by means of a tunnel junction arranged between two respective active regions, if appropriate in each case with a frequency-selective element surrounding the respective tunnel junction. By way of example, up to 10 active regions may be provided. In this way, the efficiency of the semiconductor component may be increased more extensively, if appropriate.

Furthermore, a one- or two-dimensional, linear or areal, preferably matrixlike, arrangement of semiconductor components may also be regarded as encompassed by the invention. This arrangement is preferably embodied in monolithically integrated fashion, that is to say by means of epitaxial growth of a semiconductor layer sequence for the semiconductor bodies of the various semiconductor components and preferably formation of the components on a single growth substrate. This enables a multiplicity of semiconductor components to be concentrated on a small space with a small spacing. This is particularly suitable for projection applications in which a low etendue is particularly advantageous.

Furthermore, a Fabry-Perot etalon for longitudinal mode selection may be provided, if appropriate, in the external resonator. Furthermore, the external resonator may, if appropriate, also be folded by means of one or a plurality of suitable reflective or diffractive elements. The resonator can thus be realized with a more compact construction in a simplified manner with a predetermined resonator length by means of folding of the resonator.

I claim:

1. A surface emitting semiconductor component suitable for operation with an external resonator and having an emission direction, wherein the semiconductor component includes a semiconductor body comprising:
   a plurality of active regions configured to generate radiation, each of the plural active regions being spaced apart from one another;
   a tunnel junction monolithically integrated in the semiconductor body between two active regions of said plural active regions disposed without an intervening active region between the two active regions, wherein the two active regions are electrically conductively connected by the tunnel junction during operation of the semiconductor component; and
   a frequency-selective element arranged between the two active regions,
   wherein the tunnel junction is surrounded by the frequency-selective element.

2. The semiconductor component as claimed in claim 1, further comprising two active regions of the plural active regions provided as amplifying regions for joint operation within the external resonator.

3. The semiconductor component as claimed in claim 1, wherein the semiconductor component is an electrically pumped semiconductor laser component.

4. The semiconductor component as claimed in claim 1, wherein the two active regions comprise a quantum well structure.

5. The semiconductor component as claimed in claim 1, wherein the tunnel junction comprises two tunnel semiconductor layers of different conduction types.

6. The semiconductor component as claimed in claim 1, wherein the frequency-selective element is monolithically integrated in the semiconductor body.

7. The semiconductor component as claimed in claim 1, wherein the frequency-selective element is formed such that the intensity is reduced within the frequency-selective element.

8. The semiconductor component as claimed in claim 1, in which the frequency-selective element comprises a Bragg mirror.

9. The semiconductor component as claimed in claim 8, wherein the frequency-selective element comprises a further Bragg mirror.

10. The semiconductor component as claimed in claim 9, wherein the tunnel junction is arranged between the two Bragg mirrors.

11. The semiconductor component as claimed in claim 9, wherein the two Bragg mirrors have different conduction types.

12. The semiconductor component as claimed in claim 9, wherein at least one of the Bragg mirror and the further Bragg mirror has a reflectivity of 95% or less.

13. The semiconductor component as claimed in claim 8, wherein the Bragg mirror has a reflectivity of 95% or less.

14. The semiconductor component as claimed in claim 1, wherein a current constriction element is formed in the semiconductor body between two active regions.

15. The semiconductor component as claimed in claim 1, wherein the semiconductor body contains a III-V semiconductor material, in particular a material from the III-V semiconductor material systems $In_xGa_yAl_{1-x-y}P$, $In_xGa_yAl_{1-x-y}N$ or $In_xGa_yAl_{1-x-y}As$, in each case where $0 \leq x \leq 1$, $0 \leq y \leq 1$ and $x+y \leq 1$.

16. The semiconductor component as claimed in claim 1, in which the semiconductor body contains a III-V semiconductor material, in particular a material from the III-V semiconductor material systems InGaAsN, InGaAsSb, InGaAsSbN or $In_xGa_{1-x}As_yP_{1-y}$ where $0 \leq x \leq 1$ and $0 \leq y \leq 1$.

17. The surface emitting semiconductor component as claimed in claim 1, wherein an antireflection layer is applied to an emission surface the semiconductor body.

18. A laser device, comprising:
a semiconductor component as claimed in claim 1; and
an external resonator formed by an external mirror assigned to the semiconductor component.

19. The semiconductor component as claimed in claim 18, wherein the resonator comprises an internal mirror.

20. The semiconductor component as claimed in claim 19, wherein a pump current flows through the internal mirror.

21. The semiconductor component as claimed in claim 19, wherein the internal minor is a Bragg mirror.

22. The semiconductor component as claimed in claim 18, wherein the semiconductor body is formed such that a radiation field within the resonator during operation of the semiconductor component has an intensity node within the tunnel junction.

23. The semiconductor component as claimed in claim 18, further comprising:
a frequency-converting element arranged in the resonator.

24. A surface emitting semiconductor component suitable for operation with an external resonator and having an emission direction, wherein the semiconductor component includes a semiconductor body which comprises:
a plurality of active regions configured to generate radiation, each of the plural active regions being spaced apart from one another;
a tunnel junction monolithically integrated in the semiconductor body between two active regions of said plural active regions disposed without an intervening active region between the two active regions, wherein the two active regions are electrically conductively connected by the tunnel junction during operation of the semiconductor component; and
a frequency-selective element arranged between the two active regions, said frequency selective element comprising a Bragg mirror and a further Bragg mirror,
wherein the tunnel junction is arranged between the Bragg mirror and the further Bragg mirror, and
wherein the reflectivity of at least one of the Bragg mirror and the further Bragg mirror is between 30% and 80% inclusive.

25. The surface emitting semiconductor component as claimed in claim 24, wherein the reflectivity of the Bragg mirror and the further Bragg mirror is in each case between 30% and 80% inclusive.

26. The surface emitting semiconductor component as claimed in claim 24, wherein the Bragg mirror and the further Bragg mirror have different conduction types.

27. The surface emitting semiconductor component as claimed in claim 24, wherein an antireflection layer is applied to an emission surface the semiconductor body.

* * * * *